United States Patent
Lewicki et al.

[19]

[11] Patent Number: 5,963,156
[45] Date of Patent: Oct. 5, 1999

[54] SAMPLE AND HOLD CIRCUIT AND METHOD WITH COMMON MODE DIFFERENTIAL SIGNAL FEEDBACK FOR CONVERTING SINGLE-ENDED SIGNALS TO DIFFERENTIAL SIGNALS

[75] Inventors: Laurence D. Lewicki, Sunnyvale; Ion E. Opris, Cupertino, both of Calif.

[73] Assignee: National Semiconductor Corporation, Santa Clara, Calif.

[21] Appl. No.: 08/955,896

[22] Filed: Oct. 22, 1997

[51] Int. Cl.⁶ .................................................. H03M 3/02
[52] U.S. Cl. ............................................. 341/122; 327/94
[58] Field of Search ..................................... 341/122, 123, 341/124, 125, 144, 155; 327/94, 95, 362, 415

[56] References Cited

U.S. PATENT DOCUMENTS

| | | | |
|---|---|---|---|
| 5,180,932 | 1/1993 | Bengel | 327/362 |
| 5,418,408 | 5/1995 | Mangelsdorf et al. | 327/95 |
| 5,581,254 | 12/1996 | Rundel | 341/155 |

OTHER PUBLICATIONS

Won–Chul Song, Hae–Wook Choi, Sung–Ung Kwak and Bang–Sup Song, "A 10–b 20–Msample/s Low–Power CMOS ADC", IEEE Journal of Solid–State Circuits, vol. 30, No. 5, May 1995, pp. 514–521.

*Primary Examiner*—Brian Young
*Attorney, Agent, or Firm*—Limbach & Limbach L.L.P.

[57] ABSTRACT

A sample and hold (S/H) circuit with common mode differential signal feedback for converting single-ended signals to differential signals includes a feedback loop for the input switched capacitor circuit to ensure that the input common mode voltage for the differential amplifier is maintained at a known value during the hold phase of operation. The feedback loop consists of a three-input error amplifier which monitors the two voltages at the differential input terminals of the differential amplifier in relation to the common mode reference voltage and generates a feedback voltage which is applied to the input terminals of the input switched capacitor circuit during the hold phase of operation. If both of the differential input terminal voltages are either more negative or more positive than the common mode reference voltage then the feedback voltage generated by the error amplifier is made more positive or negative, respectively.

26 Claims, 6 Drawing Sheets

SAMPLE AND HOLD CIRCUIT AND METHOD WITH COMMON MODE DIFFERENTIAL SIGNAL FEEDBACK FOR CONVERTING SINGLE-ENDED SIGNALS TO DIFFERENTIAL SIGNALS

BACKGROUND OF THE INVENTION

1. Field of the Invention

The present invention relates to sample and hold (S/H) circuits and their corresponding techniques for sampling analog signals and holding the sampled values, and in particular, to such circuits and techniques for sampling single-ended signals and holding such sampled signals as differential signals.

2. Description of the Related Art

Fully differential circuit architectures are widely used for many applications such as switched capacitor filters and analog-to-digital (A/D) converters. Important benefits of such architectures include increased noise immunity and power supply rejection, as well as automatic compensation for second order non-linearities such as capacitor voltage coefficients. However, "real world" applications involve signals which are more often single-ended. Hence, a single-ended-to-differential signal converter is usually used as an input stage.

Figure 1:
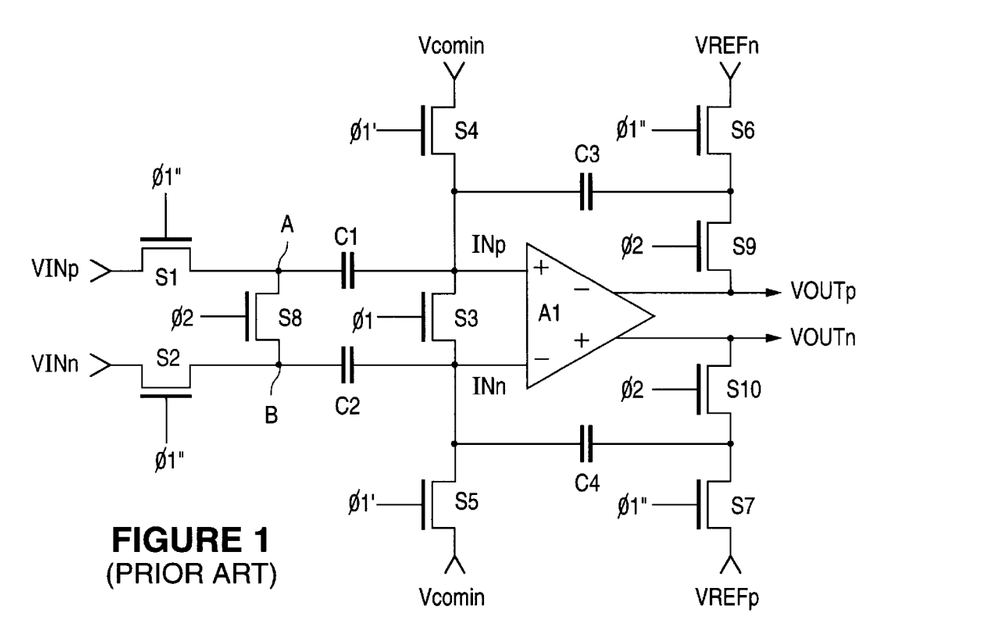
FIG. 1 is a schematic diagram of a conventional sample and hold circuit for converting single-ended signals to differential signals.

Referring to FIG. 1, a typical conventional single-ended-to-differential signal converter used as the input stage for a S/H circuit in an A/D converter using complementary metal oxide semiconductor (CMOS) technology uses switched capacitor input and output circuits controlled by non-overlapping clock signals φ1 and φ2 to control MOS switches S1–S7 and S8–S10, respectively. During the sample phase of operation, i.e., during assertion of clock signal φ1, switches S1–S7 are closed and the input signal VINp-VINn is sampled on input capacitors C1 and C2. The input terminal corresponding to the "negative" input signal phase VINn is connected to the reference potential of the actual single-ended input signal VINp, which is usually circuit ground potential. This sample clock phase φ1 is also used to bias the inputs INp, INn of the operational amplifier (op-amp) A1 to a common mode input voltage VCOMin through switches S3, S4 and S5, as well as to set the common mode output voltage (additional circuitry not shown). Switches S6 and S7 are used during the sample phase to pre-charge output feedback capacitors C3 and C4 to a known voltage. If the input voltage is unipolar, the pre-charged values are set by two different reference voltages, VREFp, VREFn which introduce offset voltages and the inputs INp, INn of the op-amp A1 which are equal to half of the full input voltage scale.

During the hold phase of operation, i.e., during assertion of clock signal phase φ2, switches S8–S10 are closed. This causes the electrical charges accumulated by the input capacitors C1, C2 to be redistributed between them and the output feedback capacitors C3, C4, thereby maintaining a quasi-null differential voltage at the inputs INp, INn of the op-amp A1.

Figure 1A:
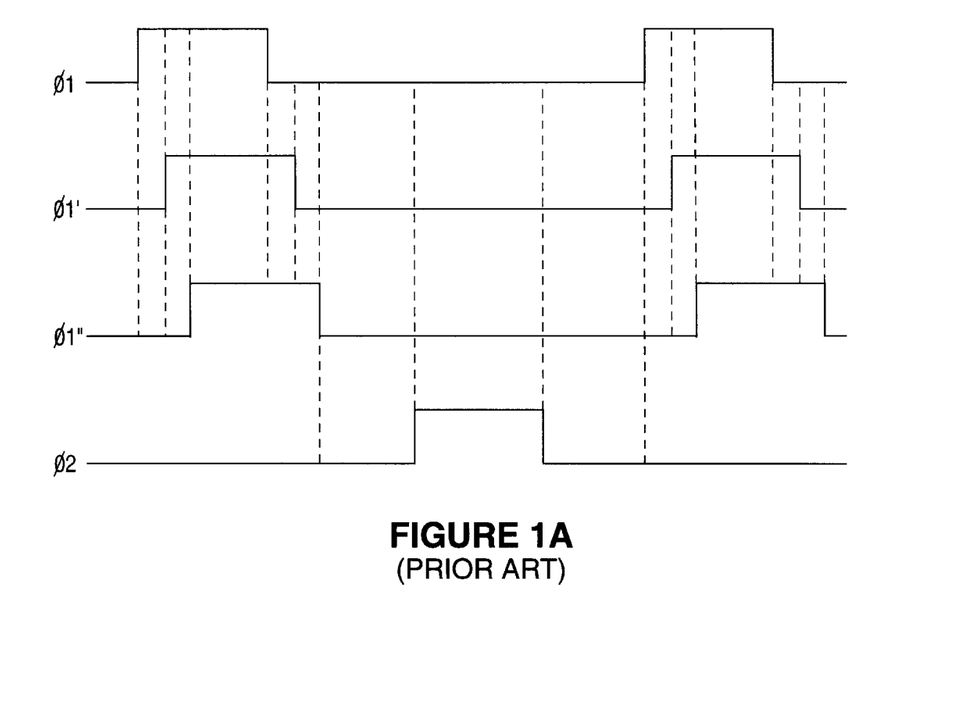
FIG. 1A is a signal timing diagram for the clock signal phases used in the circuits of FIGS. 1, 3A, 4, 6, and 7.

Referring to FIG. 1A, the phase relationships among the clock signals φ1, φ1', φ1", φ2 are shown. Clock phases φ1' and φ1" are successively delayed, overlapping versions of clock signal phase φ1, and are all non-overlapping with respect to clock signal phase φ2.

Figure 2:
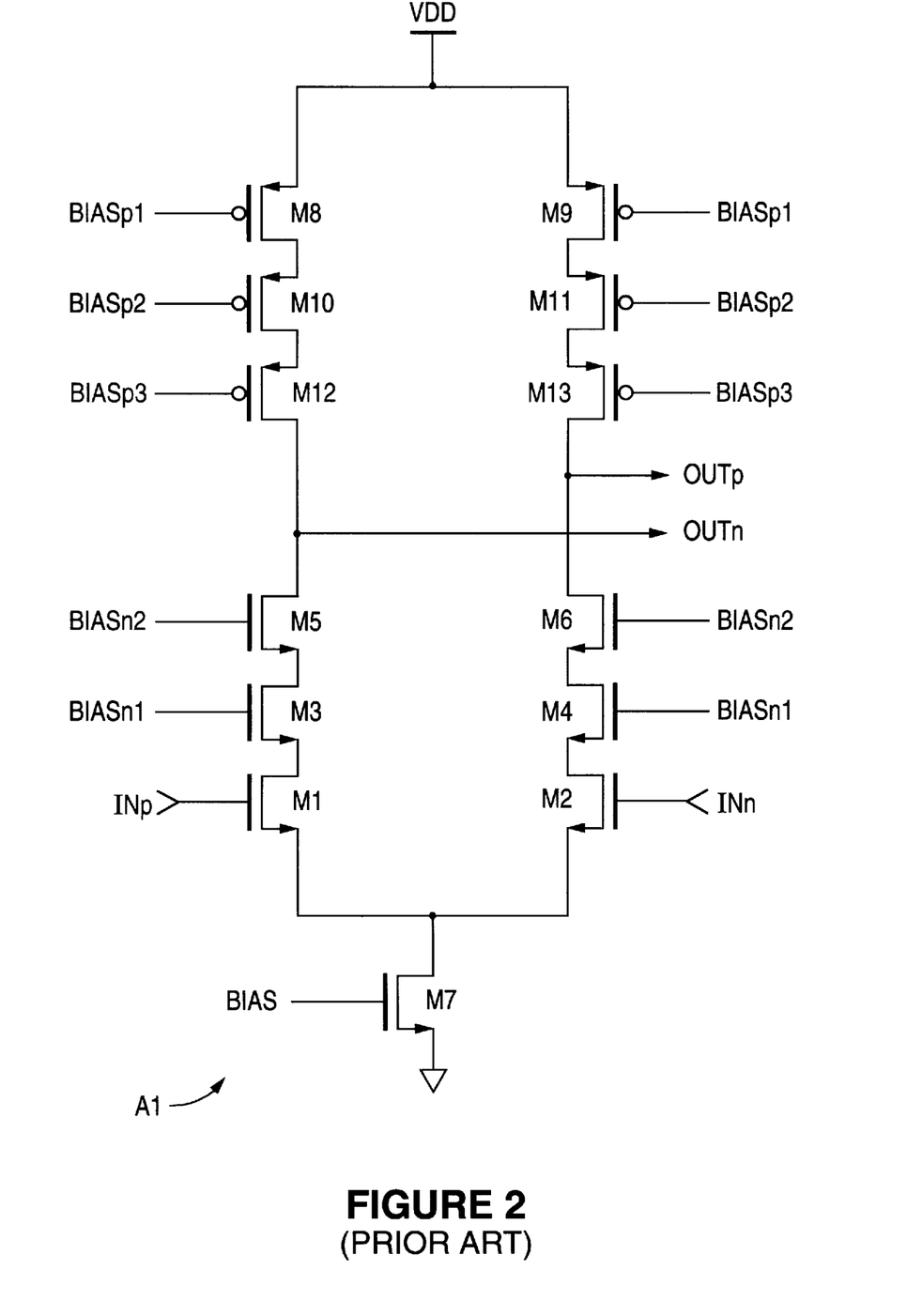
FIG. 2 is a schematic diagram of a conventional operational amplifier design for use in the circuit of FIG. 1.

Referring to FIG. 2, a typical conventional design for the op-amp A1 has a cascode architecture, as shown. For a given level of power dissipation, this architecture has a large transconductance which is necessary for fast settling in high speed circuits. Also, because of non-dominant poles at very high frequencies, the op-amp A1 does not require separate compensation capacitors which consume circuit (i.e., silicon) area and increase power dissipation. However, such a telescopic circuit configuration has disadvantages in that the output voltage range is reduced and the input common mode voltage has a small range. If this results in an input common mode voltage which is too small, the biasing transistor M7 is pushed into its linear operating region and the bias current is thereby reduced. If the input common mode voltage is too large, the input gain transistors enter their linear operating regions which results in a reduced transconductance and output impedance, thereby degrading the open loop circuit gain. Further, optimization of the output linear operating range, as established by the bias voltages for the cascode devices M3–M6, reduces the acceptable input common mode voltage range.

Another problem with the circuit of FIG. 1 is the variation of the input common mode voltage during the hold phase of operation. Ideally, redistribution of the charges accumulated by sampling capacitors C1 and C2 when switch S8 is closed and nodes INp and INn have virtually the same potential (i.e., the input common mode) would mean that the common node AB settles to a voltage potential which is equal to the arithmetic average of the input sample voltages VINp, VINn, thereby leaving the input common mode voltage of the op-amp A1 unchanged.

Figure 3A:
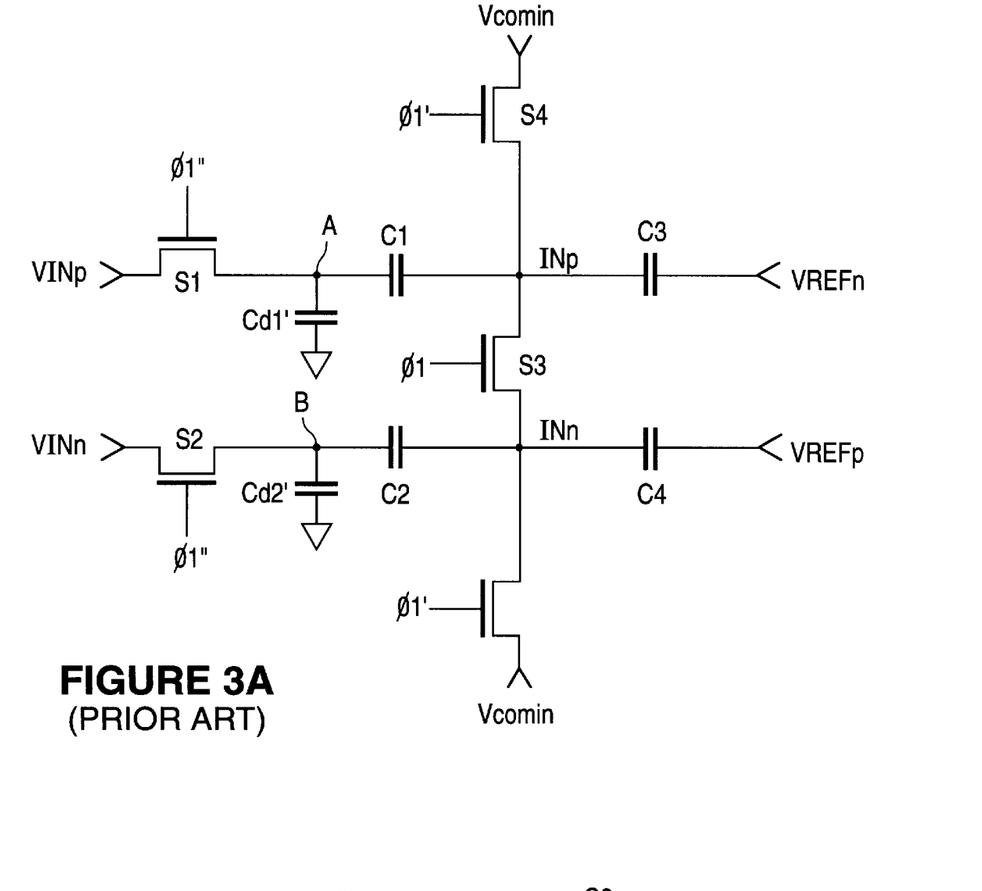
FIGS. 3A and 3B are the equivalent circuits for the sample and hold phases of operation, respectively, for the circuit of FIG. 1.
Figure 3B:
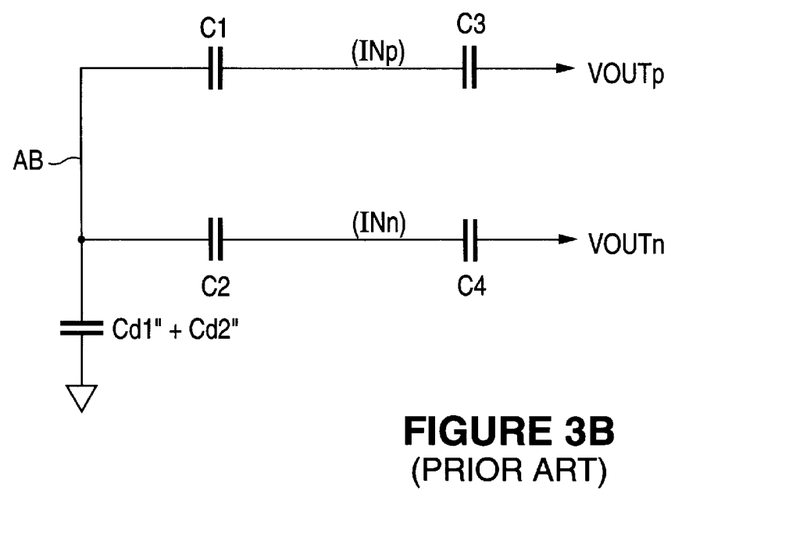

Referring to FIGS. 3A and 3B, the equations which describe this charge balancing can be written using the equivalent circuits for the sample phase of operation (FIG. 3A) and the hold phase of operation (FIG. 3B) as follows:

$$Q_{AB} = V_{in} \cdot Cd_1' + (V_{in} - Vcom_{in}) \cdot C_1 - Vcom_{in} \cdot C_2 \quad (1)$$

$$Qin_p = (Vcom_{in} - V_{in}) \cdot C_1 + (Vcom_{in} - Vref_n) \cdot C_3 \quad (2)$$

$$Qin_n = Vcom_{in} \cdot C_2 + (Vcom_{in} - Vref_p) \cdot C_4 \quad (3)$$

$$Q_{AB} + Q_1 + Q_2 - Q_8 = V_{AB} \cdot (Cd_1'' + Cd_2'') + (V_{AB} - Vcom_{in}') \cdot (C_1 + C_2) \quad (4)$$

$$Qin_p + Q_3' + Q_4 = (Vcom_{in}' - V_{AB}) \cdot C_1 + (Vcom_{in}' - Vout_p) \cdot C_3 \quad (5)$$

$$Qin_n + Q_3'' + Q_5 = (Vcom_{in}' - V_{AB}) \cdot C_2 + (Vcom_{in}' - Vout_n) \cdot C_4 \quad (6)$$

where:

$Q_{AB}$ = total charge stored in nodes A and B during sample $Qin_p$ & $Qin_n$ = charges stored in nodes $In_p$ and $In_n$, respectively, during sample $Q_1$, $Q_2$, $Q_3$, $Q_4$ & $Q_5$ = charge injection from MOS switches S1, S2, S3, S4 and S5, respectively, at turn-off (end of the sample phase)

$Q_8$ = charge absorbed from node AB by switch $S_8$ at turn-on (beginning of the hold phase)

$Vcom_{in}$ = common mode input voltage during sample phase $Vcom_{in}'$ = common mode input voltage during hold phase $V_{AB}$ = node AB voltage during hold phase $Vref_p$ & $Vref_n$ = "positive" and "negative" reference voltages, respectively, centered on the output common mode $Cd_1'$ & $Cd_2'$ = voltage dependent junction capacitances associated with switches S1 and S2, respectively, during the sample phase $Cd_1''$ & $Cd_2''$ = voltage dependent junction capacitances associated with switches S1 and S2, respectively, during the hold phase Solving Equations (1)–(6) with the additional condition of $$Vout_p + Vout_n = Vref_p + Vref_n \quad (7)$$

imposed by the output common mode feedback yields the input common mode voltage during the hold phase of operation as follows:

$$Vcom'_{in} = Vcom_{in} + \Delta V_{com} \quad (8)$$

$$\Delta V_{com} = \frac{V_{in} \cdot \Delta C_d^2 + (C_1 + C_2) \cdot \Delta Q_{AB} + (C_1 + C_2 + Cd''_1 + Cd''_2) \cdot \Delta Q_{in}}{(C_1 + C_2 + C_3 + C_4) \cdot (Cd''_1 + Cd''_2) + (C_1 + C_2) \cdot (C_3 + C_4)} \quad (9)$$

$$\Delta C_d^2 = Cd'_1 \cdot (C_1 + C_2) - C_1 \cdot (Cd''_1 + Cd''_2) \quad (10)$$

$$\Delta Q_{AB} = Q_1 + Q_2 - Q_8 \quad (11)$$

$$\Delta Q_{in} = Q_3 + Q_4 + Q_5 \quad (12)$$

High speed circuits require very large sampling switches (switches S1–S5 in the circuit of FIG. 1) in order to reduced the RC time constant of the sampling circuit and reduce the signal drop across the input dependent switch resistance. Such large switches when implemented in MOS technology have large associated capacitances Cd which are on the same order of magnitude as the sampling and hold capacitors C1–C4, and have large channel charges. Simulations have demonstrated an input common mode voltage variation of 300 millivolts or more for sampling capacitors C1, C2 of two picofarads and NMOS sampling switches S1, S2 with width and length dimensions of 400 microns and 0.8 microns, respectively. Such a voltage variation is unacceptable for most designs and will lead to a collapse of the op-amp input pair.

The circuit non-linearities are dominated by the second harmonic which is not cancelled as it would be in fully differential architectures. The signal-dependent charge injection Q1 into the common node AB by sampling switch S1 is attenuated by the symmetric arrangement of the capacitors C1–C4 only to the degree by which the input capacitors C1, C2 and the output capacitors C3, C4 are matched to one another. A first order error in the differential output voltage can be computed using equations (1)–(7) above, and has a signal-dependent term of the following form:

$$\Delta V_{out} = \Delta V_{com} \cdot \left( \epsilon_2 \cdot \frac{C_1}{C_3} + \epsilon_4 \right) \quad (13)$$

$$\epsilon_2 = \frac{C_1 - C_2}{C_1} \text{ and } \epsilon_4 = \frac{C_3 - C_4}{C_3} \quad (14)$$

where:
$\Delta V_{out}$=first-order error in differential output voltage $V_{out}$
$\Delta V_{com}$=signal dependent variation of input common mode voltage $V_{com}$
$\epsilon_2$=relative mismatch between capacitors $C_1$ and $C_2$
$\epsilon_4$=relative mismatch between capacitors $C_3$ and $C_4$ Other error terms in the differential output signal can be compensated by various calibration and/or correction techniques, but the signal-dependent term, as set forth above in Equation (13), primarily determines the degree of non-linear distortion.

Accordingly, it would be desirable to have a sample and hold circuit architecture for converting single-ended signals to differential signals while avoiding the above-discussed problems.

SUMMARY OF THE INVENTION

An apparatus and method in accordance with the present invention provides a common mode feedback technique for sample and hold circuits which convert single-ended signals to differential signals. An error amplifier is used in a separate feedback loop to establish and maintain the input common mode voltage during the hold phase of operation. Such a technique balances charge injection from large switches in high speed circuits and reduces non-linear distortion due to signal-dependent charge injection and the non-linear (i.e., voltage-dependent) junction capacitance of the input switches. Such a technique improves the linear range of the sample and hold circuit and reduces distortions due to signal-dependent charge injection and non-linear charge redistribution.

In accordance with one embodiment of the present invention, a sample and hold (S/H) circuit with common mode differential signal feedback for converting a single-ended signal to a differential signal includes an input switched capacitor circuit and a feedback circuit. The input switched capacitor circuit is configured to receive a plurality of sample and hold control signals, an input reference signal and a feedback reference signal and in accordance therewith receive and sample a single-ended input signal and in accordance therewith provide a differential input signal. The feedback circuit, coupled to the input switched capacitor circuit, is configured to receive the hold control signal, the input reference signal and the differential input signal and in accordance therewith provide the feedback reference signal.

In accordance with another embodiment of the present invention, a sample and hold (S/H) circuit with common mode differential signal feedback for converting a single-ended signal to a differential signal includes a sampling circuit and a feedback circuit. The sampling circuit is configured to receive a plurality of control signals and in accordance therewith: receive and sample a single-ended input signal during a sample phase and receive a variable feedback voltage during a hold phase and in accordance therewith provide a sampled signal; and convert the sampled signal to an intermediate differential signal in accordance with the variable feedback voltage during the hold phase, wherein the intermediate differential signal includes a common mode input voltage. The feedback circuit, coupled to the sampling circuit, is configured to monitor the common mode input voltage and a common mode reference voltage and in accordance therewith provide the variable feedback voltage, wherein the variable feedback voltage is adjusted to cause the common mode input voltage to remain substantially constant in relation to the common mode reference voltage.

In accordance with still another embodiment of the present invention, a sample and hold (S/H) method of converting a single-ended signal to a differential signal while maintaining a substantially constant common mode voltage includes the steps of: receiving a plurality of sample and hold control signals, an input reference signal and a feedback reference signal and in accordance therewith receiving and sampling a single-ended input signal and in accordance therewith generating a differential input signal; and receiving the hold control signal, the input reference signal and the differential input signal and in accordance therewith generating the feedback reference signal.

In accordance with yet another embodiment of the present invention, a sample and hold (S/H) method of converting a single-ended signal to a differential signal while maintaining a substantially constant common mode voltage includes the steps of: receiving and sampling a single-ended input signal during a sample phase to generate a sampled signal; receiving a variable feedback voltage during a hold phase; converting the sampled signal to an intermediate differential signal in accordance with the variable feedback voltage during the hold phase, wherein the intermediate differential signal includes a common mode input voltage; and monitoring the common mode input voltage and a common mode reference voltage and in accordance therewith adjusting the variable feedback voltage, wherein the adjusting of the variable feedback voltage causes the common mode input voltage to remain substantially constant in relation to the common mode reference voltage.

These and other features and advantages of the present invention will be understood upon consideration of the following detailed description of the invention and the accompanying drawings.

DETAILED DESCRIPTION OF THE DRAWINGS

Figure 4:
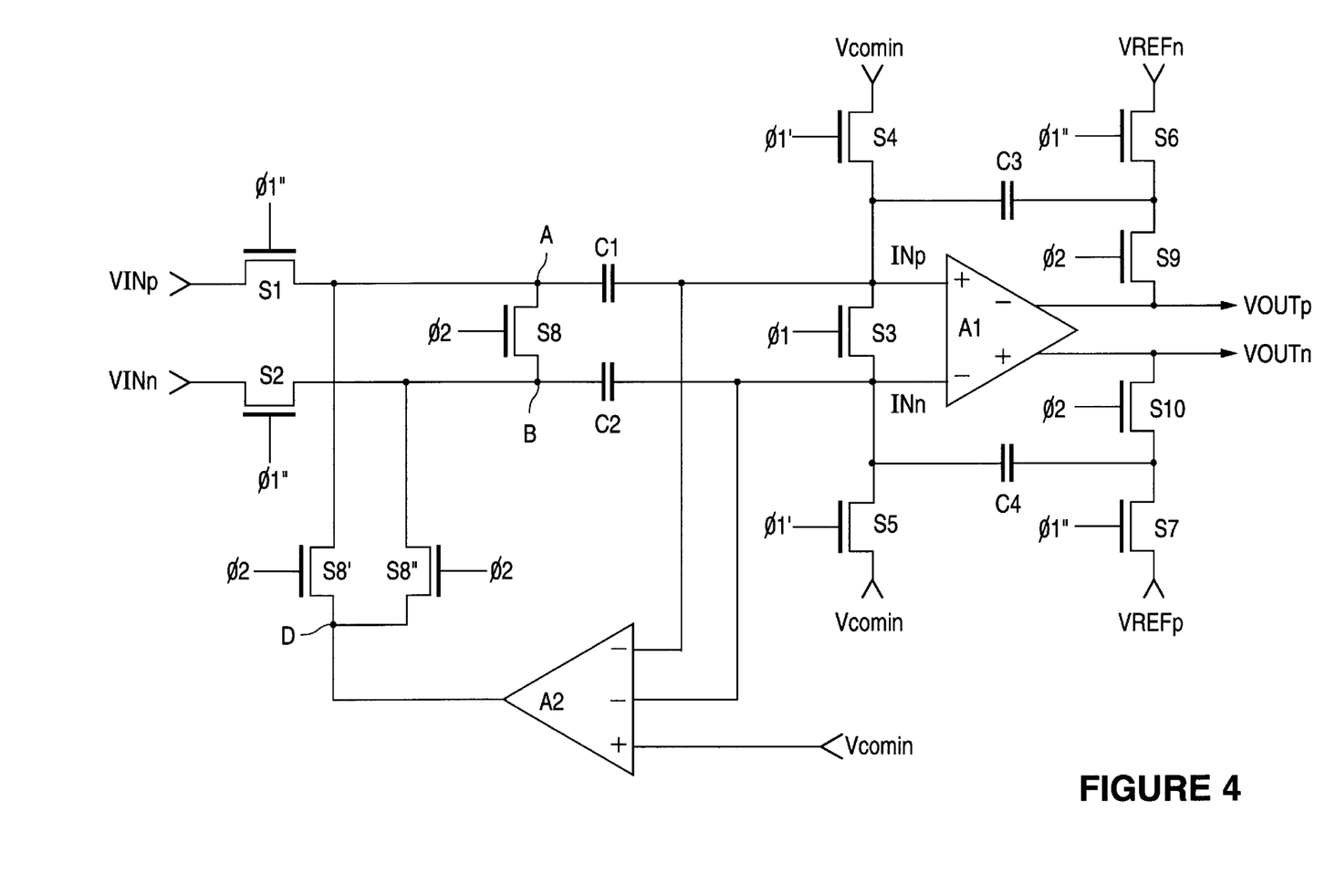
FIG. 4 is a schematic diagram of a sample and hold circuit in accordance with one embodiment of the present invention.

Referring to FIG. 4, a sample and hold circuit in accordance with one embodiment of the present invention includes a feedback loop formed by a three-input error amplifier A2 and two switch circuits S8', S8" connected to the sample and hold circuit of FIG. 1. The error amplifier A2 monitors the input nodes INp, INn of the op-amp A1 and compares their voltages to the common mode voltage VCOMin. The output of the error amplifier A2 is connected to the common node AB during the hold phase of operation (i.e., during assertion of clock signal phase φ2) through switches S8, S8' and S8". This feedback loop maintains the input common mode voltage at the input terminals INp, INn of the op-amp A1 at the common mode voltage reference VCOMin during the hold phase of operation.

This technique provides two major advantages. First, the input common mode voltage at the input terminals INp, INn of the op-amp A1 is guaranteed to be substantially maintained at the common mode voltage reference VCOMin, thereby ensuring that the main op-amp A1 does not collapse due to large charge injection at its input nodes INp, INn and non-linear charge redistribution in the junction capacitances CD1, CD2. Additionally, by setting the input common mode voltage to a known value, in this case the reference voltage VCOMin, the output linear range of the op-amp A1 can be optimized. The second advantage is that by driving the common node AB during the hold phase of operation, the effects of the signal-dependent charge injection Q1 and the non-linear charge redistribution in the junction capacitances Cd1, Cd2 are cancelled. Since the input common mode voltage is established by this secondary feedback loop, all signal-dependent errors in the differential output signal are significantly reduced.

Figure 5:
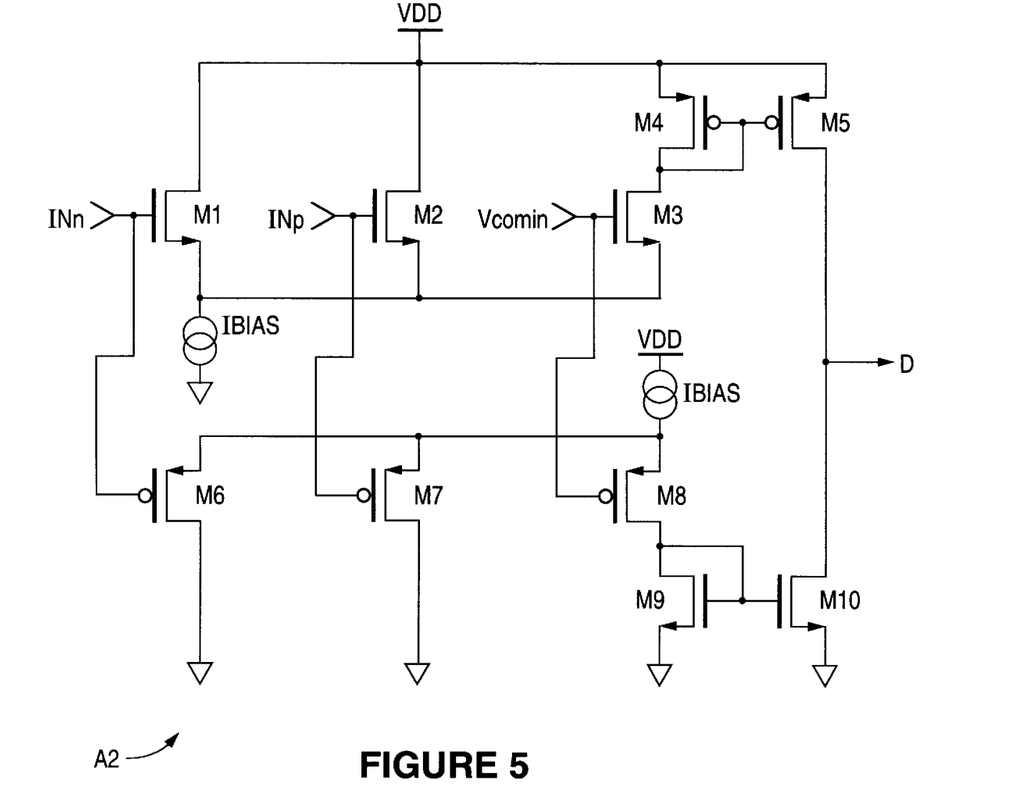
FIG. 5 is a schematic diagram of the error amplifier in the circuit of FIG. 4.

Referring to FIG. 5, the feedback amplifier A2 can be implemented as shown. The inputs INp, INn, VCOMin are connected to matched NMOS M1–M3 and PMOS M6–M8 transistors in common source configurations. If both signal inputs INp, INn are lower in voltage than the reference VCOMin, the drain current of transistor M3 increases and, due to the operation of the current mirror formed by transistors M4 and M5, the output terminal D is driven to a high potential. Complementary operations are performed by corresponding input devices M6–M8 and current mirror devices M9 and M10. Hence, if both inputs INp, INn are higher in potential than the reference VCOMin, then the drain current of transistor M8 increases and the output terminal D is pulled low by the operation of the current mirror formed by transistors M9 and M10. If one of the two inputs INp, INn is above and one is below the reference VCOMin, the error amplifier A2 is inactive, i.e., terminal D remains at its present potential. One example of this last condition is where the input common mode voltage is correct but a large differential voltage appears at the inputs INp, INn during the slewing of the op-amp A1 at the beginning of a hold phase of operation.

The error amplifier A2 does not have critical settling requirements and can be implemented with relatively small devices and low power dissipation. Any non-settling error at the common node AB will be further attenuated by the matching of the sampling C1, C2 and feedback C3, C4 capacitors. However, the error amplifier A2 should be powerful enough to bring the input common mode voltage very close to the reference VCOMin as quickly as possible so as to allow maximum settling time for the op-amp A1.

Figure 6:
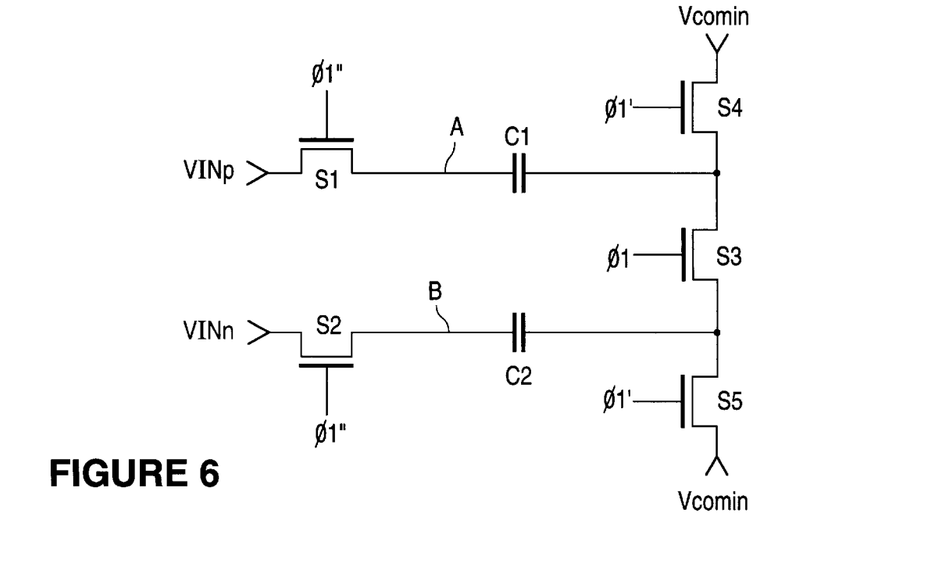
FIG. 6 is a schematic diagram of the equivalent circuit for the input portion of the circuit of FIG. 4 during the sample phase of operation.

Referring to FIG. 6, the charging and discharging currents of the sampling capacitors C1, C2 flow through switches S3–S5 into the node for the reference voltage VCOMin. Hence, any signal-dependent variations in the reference voltage VCOMin will generate further signal-dependent differential charge injection (from switches S3–S5) into the input nodes INp, INn, as well as a large non-linear distortion in the overall operation of the sample and hold circuit. However, providing a low impedance buffer for the reference voltage VCOMin is undesirable due to the necessary circuit area and power dissipation.

Figure 7:
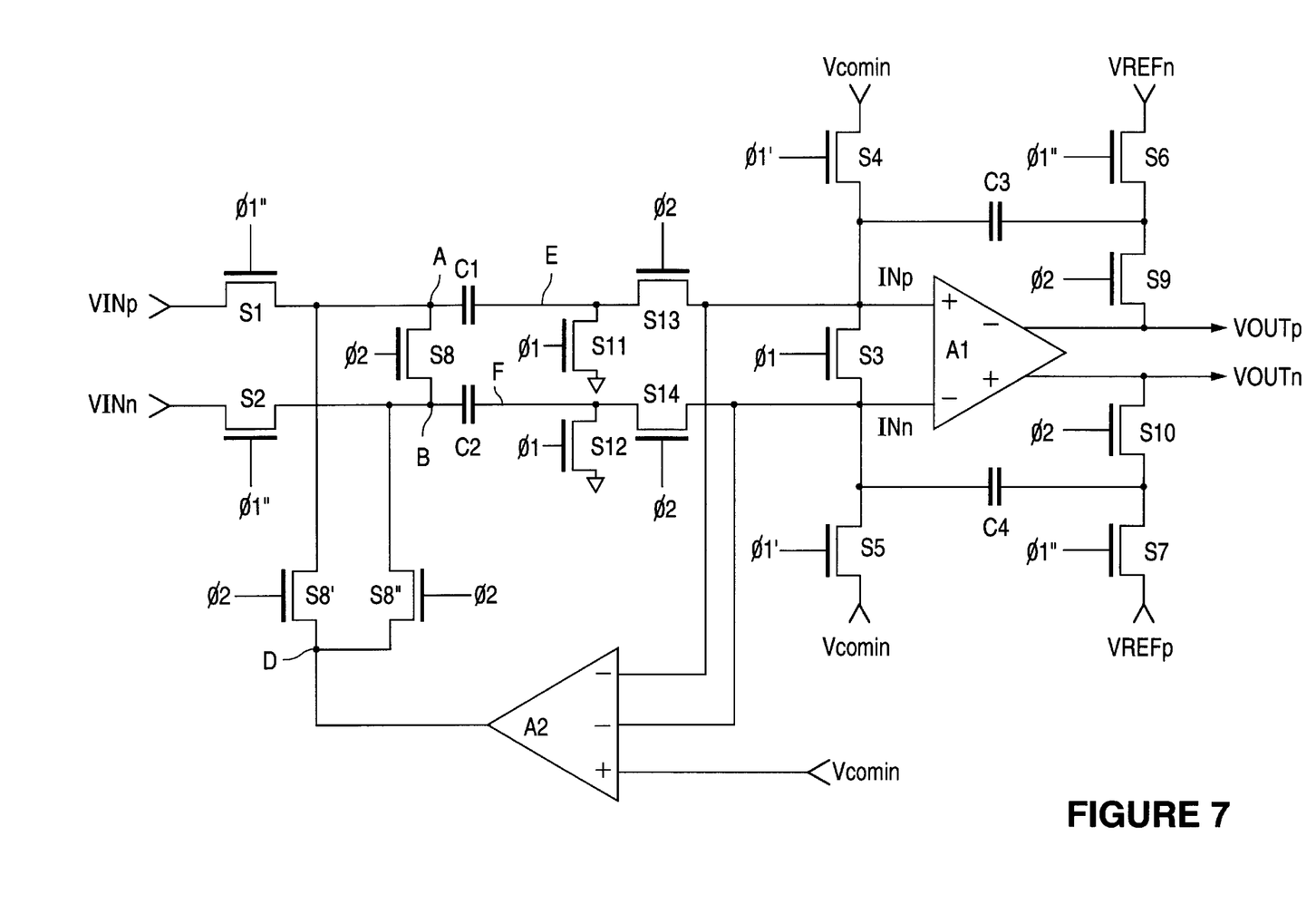
FIG. 7 is a schematic diagram of a sample and hold circuit in accordance with another embodiment of the present invention.

Referring to FIG. 7, a sample and hold circuit in accordance with another embodiment of the present invention addresses this problem by the introduction of additional switches S11, S12, S13, S14, connected substantially as shown. During the sample phase of operation, switches S11 and S12 are closed and the input signal is sampled on capacitors C1 and C2. In this case, the return path for the signal is circuit ground rather than the common mode reference VCOMin line. This avoids the need for a buffer circuit for the reference voltage VCOMin. During the hold mode of operation, switches S11 and S12 are open and switches S13 and S14 are closed. The error amplifier A2 is then used to set the correct common mode voltage at the inputs INp, INn of the op-amp A1.

This ground sampling technique requires the use of the input common mode error amplifier A2. The common mode voltage during the sampling phase at nodes E and F is circuit ground potential, while during the hold phase of operation the common mode voltage at nodes E and F becomes equal to the common mode reference voltage VCOMin. Hence, with the use of the error amplifier A2, this ground sampling technique has the same advantages as that of FIG. 4, as discussed above.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a sample and hold (S/H) circuit with common mode differential signal feedback for converting a single-ended signal to a differential signal, comprising:

an input switched capacitor circuit configured to receive a plurality of sample and hold control signals, an input reference signal and a feedback reference signal and in accordance therewith receive and sample a single-ended input signal and in accordance therewith provide a differential input signal; and a feedback circuit, coupled to said input switched capacitor circuit, configured to receive said hold control signal, said input reference signal and said differential input signal and in accordance therewith provide said feedback reference signal.

2. The apparatus of claim 1, wherein:

said differential input signal includes first and second signal phases; and said feedback reference signal varies in relation to whether either one or both of said first and second differential input signal phases are more positive or negative than said input reference signal.

3. The apparatus of claim 1, wherein:

said differential input signal includes first and second signal phases;

during a sample phase time period said first and second differential input signal phases are substantially equal to each other and substantially constant in relation to said input reference signal; and during a hold phase time period at least one of said first and second differential input signal phases is substantially unequal to said input reference signal.

4. The apparatus of claim 1, wherein said input switched capacitor circuit comprises:

first and second capacitive circuits; and a plurality of switch circuits, coupled to said first and second capacitive circuits, configured to receive said plurality of sample and hold control signals and in accordance therewith isolate said first and second capacitive circuits from each other during a sample phase time period, and couple together said first and second capacitive circuits during a hold phase time period.

5. The apparatus of claim 4, wherein:

each one of said first and second capacitive circuits individually accumulate first and second pluralities of charges, respectively, in accordance with said single-ended input signal during said sample phase time period; and said first and second capacitive circuits share said first and second pluralities of charges during said hold phase time period.

6. The apparatus of claim 1, wherein:

said differential input signal includes first and second signal phases; and said feedback circuit comprises an amplifier with first, second and third input signal terminals configured to receive said first and second differential input signal phases and said input reference signal, respectively, and in accordance therewith provide said feedback reference signal.

7. The apparatus of claim 6, wherein said feedback reference signal becomes more positive or more negative in accordance with whether both of said first and second differential input signal phases are more positive or negative than said input reference signal.

8. The apparatus of claim 1, wherein said input switched capacitor circuit includes a plurality of signal switch circuits configured to receive one of said plurality of sample control signals and said hold control signal and in accordance therewith, during a sample phase time period, isolate first and second portions of said input switched capacitor circuit from each other and couple said first portion of said input switched capacitor circuit to a circuit reference node.

9. The apparatus of claim 1, wherein said input switched capacitor circuit is further configured to receive a plurality of input offset signals and in accordance therewith provide said differential input signal, and further comprising:

an output switched capacitor circuit, coupled to said input switched capacitor circuit, configured to receive another plurality of sample and hold control signals, a plurality of output reference signals and a differential output signal and in accordance therewith provide said plurality of input offset signals; and a differential amplifier circuit, coupled between said input and output switched capacitor circuits, configured to receive said differential input signal and in accordance therewith provide said differential output signal.

10. The apparatus of claim 9, wherein said output switched capacitor circuit comprises:

first and second capacitive circuits; and a plurality of switch circuits, coupled to said first and second capacitive circuits, configured to receive said another plurality of sample and hold control signals;

wherein said first and second capacitive circuits receive said plurality of output reference signals during a sample phase time period, and said first and second capacitive circuits receive said differential output signal and provide said plurality of input offset signals during a hold phase time period.

11. The apparatus of claim 9, wherein said differential amplifier circuit comprises a differential amplifier with a differential input and a differential output.

12. An apparatus including a sample and hold (S/H) circuit with common mode differential signal feedback for converting a single-ended signal to a differential signal, comprising:

a sampling circuit configured to receive a plurality of control signals and in accordance therewith receive and sample a single-ended input signal during a sample phase and receive a variable feedback voltage during a hold phase and in accordance therewith provide a sampled signal, and convert said sampled signal to an intermediate differential signal in accordance with said variable feedback voltage during said hold phase, wherein said intermediate differential signal includes a common mode input voltage; and a feedback circuit, coupled to said sampling circuit, configured to monitor said common mode input voltage and a common mode reference voltage and in accordance therewith provide said variable feedback voltage, wherein said variable feedback voltage is adjusted to cause said common mode input voltage to remain substantially constant in relation to said common mode reference voltage.

13. The apparatus of claim 12, wherein said sampling circuit comprises a switched capacitor circuit configured to:

accumulate first and second individual pluralities of charges in accordance with said single-ended input signal during said sample phase; and combine said first and second individual pluralities of charges during said hold phase.

14. The apparatus of claim 12, wherein said feedback circuit comprises a voltage comparison circuit configured to:

compare first and second components of said common mode input voltage to said common mode reference voltage;

make said variable feedback voltage more positive when said first and second components of said common mode input voltage both move in one direction in relation to said variable feedback voltage; and make said variable feedback voltage more negative when said first and second components of said common mode input voltage both move in another direction in relation to said variable feedback voltage.

15. A sample and hold (S/H) method of converting a single-ended signal to a differential signal with common mode differential signal feedback, said method comprising the steps of:

receiving a plurality of sample and hold control signals, an input reference signal and a feedback reference signal and in accordance therewith receiving and sampling a single-ended input signal and in accordance therewith generating a differential input signal; and receiving said hold control signal, said input reference signal and said differential input signal and in accordance therewith generating said feedback reference signal.

16. The method of claim 15, wherein said differential input signal includes first and second signal phases and said step of receiving said hold control signal, said input reference signal and said differential input signal and in accordance therewith generating said feedback reference signal comprises varying said feedback reference signal in relation to whether either one or both of said first and second differential input signal phases are more positive or negative than said input reference signal.

17. The method of claim 15, wherein said step of receiving a plurality of sample and hold control signals, an input reference signal and a feedback reference signal and in accordance therewith receiving and sampling a single-ended input signal and in accordance therewith generating a differential input signal comprises generating a differential input signal with first and second signal phases, and wherein:

during a sample phase time period said first and second differential input signal phases are substantially equal to each other and substantially constant in relation to said input reference signal; and during a hold phase time period at least one of said first and second differential input signal phases is substantially unequal to said input reference signal.

18. The method of claim 15, wherein said step of receiving a plurality of sample and hold control signals, an input reference signal and a feedback reference signal and in accordance therewith receiving and sampling a single-ended input signal and in accordance therewith generating a differential input signal comprises:

accumulating first and second individual pluralities of charges in accordance with said single-ended input signal during a sample phase time period; and combining said first and second individual pluralities of charges during a hold phase time period.

19. The method of claim 15, wherein said differential input signal includes first and second signal phases and said step of receiving said hold control signal, said input reference signal and said differential input signal and in accordance therewith generating said feedback reference signal comprises receiving and comparing said first and second differential input signal phases with said input reference signal and in accordance therewith generating said feedback reference signal.

20. The method of claim 19, wherein said step of receiving and comparing said first and second differential input signal phases with said input reference signal and in accordance therewith generating said feedback reference signal comprises generating a more positive or more negative signal as said feedback reference signal in accordance with whether both of said first and second differential input signal phases are more positive or negative than said input reference signal.

21. The method of claim 15, wherein said step of receiving a plurality of sample and hold control signals, an input reference signal and a feedback reference signal and in accordance therewith receiving and sampling a single-ended input signal and in accordance therewith generating a differential input signal further comprises receiving a plurality of input offset signals and generating said differential input signal in further accordance therewith, and wherein said method further comprises the steps of:

receiving another plurality of sample and hold control signals, a plurality of output reference signals and a differential output signal and in accordance therewith generating said plurality of input offset signals; and buffering said differential input signal and in accordance therewith generating said differential output signal.

22. The method of claim 21, wherein said step of receiving another plurality of sample and hold control signals, a plurality of output reference signals and a differential output signal and in accordance therewith generating said plurality of input offset signals comprises:

receiving said plurality of output reference signals during a sample phase time period; and receiving said differential output signal and generating said plurality of input offset signals during a hold phase time period.

23. A sample and hold (S/H) method of converting a single-ended signal to a differential signal while maintaining a substantially constant common mode voltage, said method comprising the steps of:

receiving and sampling a single-ended input signal during a sample phase to generate a sampled signal;

receiving a variable feedback voltage during a hold phase;

converting said sampled signal to an intermediate differential signal in accordance with said variable feedback voltage during said hold phase, wherein said intermediate differential signal includes a common mode input voltage; and monitoring said common mode input voltage and a common mode reference voltage and in accordance therewith adjusting said variable feedback voltage, wherein said adjusting of said variable feedback voltage causes said common mode input voltage to remain substantially constant in relation to said common mode reference voltage.

24. The method of claim 23, wherein said step of receiving and sampling a single-ended input signal during a sample phase to generate a sampled signal comprises accumulating first and second individual pluralities of charges in accordance with said single-ended input signal during said sample phase.

25. The method of claim 24, wherein said step of converting said sampled signal to an intermediate differential signal in accordance with said variable feedback voltage during said hold phase comprises combining said first and second individual pluralities of charges during said hold phase.

26. The method of claim 23, wherein said step of monitoring said common mode input voltage and a common mode reference voltage and in accordance therewith adjusting said variable feedback voltage comprises:

comparing first and second components of said common mode input voltage to said common mode reference voltage;

making said variable feedback voltage more positive when said first and second components of said common mode input voltage both move in one direction in relation to said variable feedback voltage; and making said variable feedback voltage more negative when said first and second components of said common mode input voltage both move in another direction in relation to said variable feedback voltage.

* * * * *